United States Patent
Dyck et al.

(10) Patent No.: US 6,393,913 B1
(45) Date of Patent: May 28, 2002

(54) MICROELECTROMECHANICAL DUAL-MASS RESONATOR STRUCTURE

(75) Inventors: Christopher W. Dyck, Cedar Crest; James J. Allen, Albuquerque, both of NM (US); Robert J. Huber, Bountiful, UT (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/500,120

(22) Filed: Feb. 8, 2000

(51) Int. Cl.$^7$ .................................. G01P 9/04

(52) U.S. Cl. .................... 73/504.12; 333/186

(58) Field of Search .................. 73/504.12, 504.13, 73/504.14, 504.15, 504.16; 333/186

(56) References Cited

U.S. PATENT DOCUMENTS

| | | | |
|---|---|---|---|
| 4,467,651 A | 8/1984 | Peters | 73/497 |
| 4,517,841 A | 5/1985 | Peters | 73/517 AV |
| 4,766,768 A | 8/1988 | Norling | 73/497 |
| 4,872,342 A | 10/1989 | Hanson | 73/517 R |
| 4,945,765 A | 8/1990 | Roszhart | 73/517 ZV |
| 5,176,031 A | 1/1993 | Peters | 73/516 R |
| 5,455,547 A | 10/1995 | Lin | 333/186 |
| 5,528,939 A | 6/1996 | Martin | 73/702 |
| 5,537,083 A | 7/1996 | Lin | 333/186 |
| 5,559,291 A * | 9/1996 | Hasegawa | 73/504.12 |
| 5,563,344 A | 10/1996 | Kaiser | 73/514.24 |
| 5,589,082 A | 12/1996 | Lin | 216/2 |
| 5,656,778 A | 8/1997 | Roszhardt | 73/504.04 |
| 5,804,084 A | 9/1998 | Nasby | 216/2 |
| 5,955,668 A * | 9/1999 | Hsu et al. | 73/504.12 |
| 5,955,932 A | 9/1999 | Nguyen | 333/186 |
| 5,969,249 A | 10/1999 | Roessig | 73/514.15 |
| 6,250,156 B1 * | 6/2001 | Seshia et al. | 73/504.12 |

OTHER PUBLICATIONS

J.P. Den Hartog, *Mechanical Vibrations* (McGraw–Hill Book Co., Inc., New York, 1956), pp. 86–105.

S. Bouwstra, J. van Rooijen, H.A.C. Tilmans, A. Selvakumar and K. Najafi, "Thermal Base Drive for Micromechanical Resonators Employing Deep–Diffusion Bases," *Sensors and Actuators A*, vol. 37–38, pp. 38–44, 1993.

W. Geiger, B. Folkmer, U. Sobe, H. Sandmaier and W. Lang, "New Designs of Micromachined Vibrating Rate Gyroscopes with Decoupled Oscillation Modes," *Sensors and Actuators A*, vol. 66, pp. 118–124, 1998.

T. Usuda, "Operational Characteristics of Electrostatically Driven Torsional Resonator with Two Degrees of Freedom," *Sensors and Actuators A*, vol. 64, pp. 255–257, 1998.

L. Lin, R.T. Howe and A.P. Pisano, "Microelectromechanical Filters for Signal Processing," *IEEE Journal of Microelectromechanical Systems*, vol. 7, pp. 286–294, Sep. 1998.

W. Lang, "Reflections on the Future of Microsytems," *Sensors and Actuators A*, vol. 72, pp. 1–15, 1999.

(List continued on next page.)

*Primary Examiner*—John E. Chapman
(74) *Attorney, Agent, or Firm*—John P. Hohimer

(57) ABSTRACT

A dual-mass microelectromechanical (MEM) resonator structure is disclosed in which a first mass is suspended above a substrate and driven to move along a linear or curved path by a parallel-plate electrostatic actuator. A second mass, which is also suspended and coupled to the first mass by a plurality of springs is driven by motion of the first mass. Various modes of operation of the MEM structure are possible, including resonant and antiresonant modes, and a contacting mode. In each mode of operation, the motion induced in the second mass can be in the range of several microns up to more than 50 $\mu$m while the first mass has a much smaller displacement on the order of one micron or less. The MEM structure has applications for forming microsensors that detect strain, acceleration, rotation or movement.

37 Claims, 8 Drawing Sheets

OTHER PUBLICATIONS

U. Breng, W. Gutmann, P. Leinfelder, B. Ryrko, S. Zimmerman, D. Billep, T. Gessner, K. Hiller and M. Wiemer, "µCORS—A Bulk Micromachined Gyroscope Based on Coupled Resonators," *Proceedings of Transducers '99*, Sendai, Japan, Jun. 7–10, 1999, pp. 1570–1573.

C.W. Dyck, J.J. Allen and R.J. Huber, "Parallel–Plate Electrostatic Dual–Mass Oscillator," *Proceedings of the SPIE Conference on Micromachined Devices and Components V*, SPIE vol. 3876, Sep. 20–21, 1999, pp. 198–209.

* cited by examiner

MICROELECTROMECHANICAL DUAL-MASS RESONATOR STRUCTURE

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to microelectromechanical (MEM) devices, and in particular to a dual-mass resonator structure which can be used, for example, to form microsensors that detect strain, acceleration, rotation or movement.

BACKGROUND OF THE INVENTION

Microelectromechanical (MEM) devices are microminiature devices formed on a substrate using fabrication process steps common to the integrated circuit (IC) fabrication industry. These MEM devices generally combine electrical and mechanical functionality to form many different kinds of electromechanical devices including accelerometers, sensors, motors, switches, relays, coded locks, micromirrors and microfluidic devices.

Motion in the various kinds of MEM devices can be produced electrostatically through the use of comb actuators comprising a plurality of interdigitated fingers which produce relatively large displacements of up to 10 microns or more, but which require high operating voltages on the order of 100 volts or more. Alternately, parallel-plate electrostatic actuators without interdigitated fingers can be used to provide displacements of generally up to about 1 micron when operated at low voltages of about 20 volts or less. There is currently a need for MEM structures which are capable of providing relatively large displacements of several microns or more at low applied drive voltages of several volts for compatibility with integrated circuitry (e.g. CMOS circuitry). There is also a need for MEM resonator structures which are relatively insensitive to damping produced by an atmospheric ambient and to changes in pressure and temperature. Such MEM devices would be less costly to manufacture since they would not require vacuum encapsulation.

The present invention provides such a MEM structure which operates at low voltages (e.g. 4–15 volts) to provide displacements in a range of about 1–50 $\mu$m, with the MEM structure being relatively insensitive to changes in pressure and temperature when operating near an antiresonant frequency.

SUMMARY OF THE INVENTION

The present invention relates to a microelectromechanical (MEM) structure, comprising a parallel-plate electrostatic actuator which further comprises a plurality of stationary electrodes formed on a substrate and a first mass suspended above the substrate to form a moveable electrode, with the first mass moving along a path in a plane parallel to the plane of the substrate in response to an actuation voltage applied between the stationary electrodes and the first mass; and a second mass suspended above the substrate and coupled to the first mass by a plurality of springs, with the second mass being driven by motion of the first mass to move along the same path. According to the present invention, each stationary electrode is located within a window formed through the first mass. Additionally, the second mass can optionally be located within a window formed through the first mass so that the first mass surrounds the second mass. The opposite arrangement is also possible with the first mass being located within a window formed in the second mass so that the first mass is surrounded by the second mass. In some cases, the second mass can be located adjacent to the first mass (e.g. when a pair of first masses are each arranged to drive a second masses, with the second masses being driven out-of-phase with respect to each other).

Various oscillatory modes of the MEM structure of the present invention are possible, with the second mass being driven to move along the same path as the first mass and either in-phase (i.e. in the same direction) with respect to the first mass or out-of-phase (e.g. 90° or 180° out-of-phase) with respect to the first mass. Oscillatory motion of the first mass can be further used to drive the second mass at or near a resonant frequency, or alternately at or near an antiresonant frequency. Finally, a contacting mode of operation is possible for the MEM structure 10. Such oscillatory motion as required for the various modes as described above can be produced using a cyclic (e.g. sinusoidal) actuation voltage.

An advantage of the present invention is that an extent of motion of the second mass can be larger than the extent of motion of the first mass upon actuation of the first mass. This is useful for providing motion of the second mass over a displacement of several microns or more while using a low-voltage (e.g. $\leq$15 volts) parallel-plate actuator which itself moves over a much more limited displacement range generally on the order of one micron or less.

Embodiments of the present invention can be formed as MEM structures providing either linear motion (i.e. along a straight path) or curvilinear motion (i.e. along a curved path). The MEM structures can further include a position-sensing electrode superposed with the second mass, and a ground plane underlying the first mass. Various embodiments of the present invention can be formed by surface micromachining utilizing a silicon substrate and one or more deposited and patterned layers of polycrystalline silicon for forming the first and second masses.

The present invention further relates to a MEM structure, comprising a substrate; a first mass suspended above the substrate and having a plurality of windows formed therethrough; a plurality of stationary electrodes formed on the substrate with each stationary electrode being located within one of the windows in the first mass, the stationary electrodes acting in combination with the first mass to form a parallel-plate electrostatic actuator to electrostatically move the first mass relative to the substrate along a path in response to an actuation voltage provided between the stationary electrodes and the first mass; a second mass coupled to the first mass through a plurality of springs, with the second mass being driven to move along the same path in response to motion of the first mass; and a position-sensing electrode located on the substrate below the second mass. The MEM structure can further include a ground plane formed on the substrate underneath the first mass.

The motion of the first and second masses can be oscillatory (e.g. using a sinusoidal actuation voltage, $V=V_0 \sin\omega t$), with the extent of motion of the second mass being larger than the extend of motion of the first mass, and with the second mass, in some instances, moving along the path in a direction opposite that of the first mass. The second mass can be driven near a a resonant or antiresonant frequency by the oscillatory motion of the first mass, or can be driven in a contacting mode wherein the first mass is driven to contact at least a portion of the stationary electrodes. In embodiments of the present invention, the first mass can be fabricated to surround the second mass or to be surrounded by the second mass. The first and second masses can also be located proximate to each other, but not surrounding each other. Each of the first and second masses can be formed from one or more deposited and patterned layers of polycrystalline silicon (i.e. polysilicon). The MEM structure of the present invention can be operated at an actuation voltage that is generally $\leq 15$ volts, and in some instances $\leq 5$ volts.

The present invention also relates to a MEM structure, comprising a parallel-plate electrostatic actuator formed on a substrate and comprising a first mass suspended above the substrate and having a plurality of windows formed therethrough, and a plurality of stationary electrodes formed on the substrate at the locations of the windows in the first mass, the stationary electrodes acting in combination with the first mass to electrostatically move the first mass along a path in response to an actuation voltage provided between the stationary electrodes and the first mass; and a second mass located within one of the windows in the first mass, with the second mass being coupled to the first mass through a plurality of springs and further being driven to move along the same path as the first mass in response to motion of the first mass. Each spring coupling the first mass to the second mass can comprise a folded spring (i.e. a flexure).

The substrate can comprise, for example, silicon; and the first and second masses can comprise, for example, polysilicon. The second mass generally has a range of motion that is substantially larger than the range of motion of the first mass.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
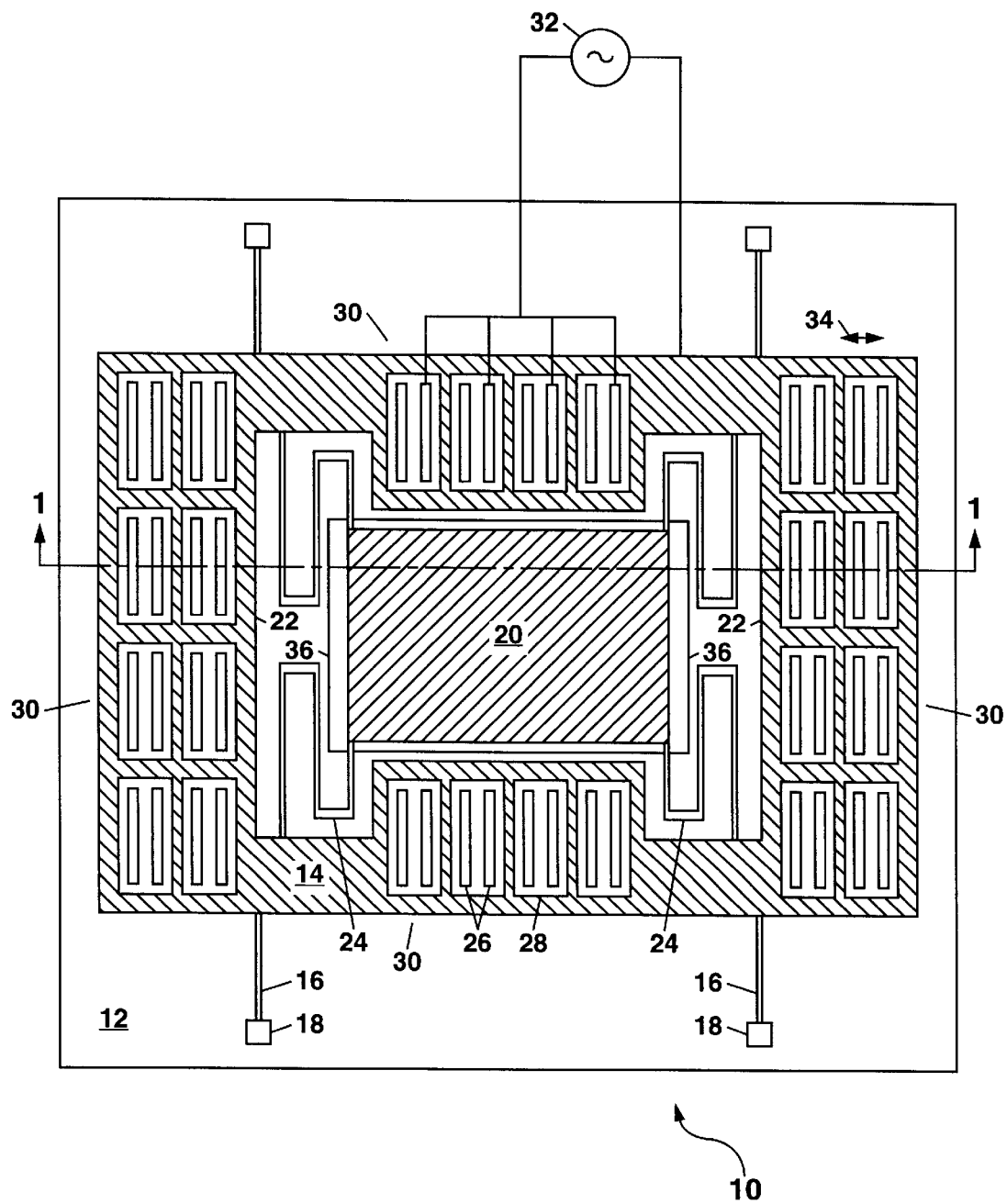
FIG. 1 schematically illustrates in plan view a first embodiment of the MEM structure of the present invention.

Referring now to the drawings, wherein like reference numerals refer to similar or identical parts throughout the several views, and more specifically to FIG. 1 thereof, there is shown schematically a first embodiment of the microelectromechanical (MEM) structure 10 of the present invention. The MEM structure 10 according to the first embodiment in FIG. 1 is formed on a substrate 12 and comprises a first mass 14 suspended above the substrate 12 by a plurality of linear springs 16 attached to the substrate via anchors 18, and a second mass 20 located within a large window 22 formed through the first mass 14. The second mass 20 is coupled to the first mass 14 through a plurality of folded springs 24 which can bend in a plane parallel to the substrate 12 to provide a relatively large displacement with a linear spring constant. Additional springs (not shown) can be connected between the second mass 20 and the substrate 12 if needed to help suspend the second mass 20 above the substrate 12.

The MEM structure 10 further includes a plurality of stationary electrodes 26 formed on the substrate 12, with each stationary electrode 26 being located within a small window 28 formed through the first mass 14. The sides of the small windows 28 which are parallel to the stationary electrodes 26 act as moveable electrodes so that the stationary electrodes 26 acting in combination with the first mass 14 form a parallel-plate electrostatic actuator 30. The parallel-plate electrostatic actuator 30, in response to an actuationvoltage provided by a source 32 between a particular set of the stationary electrodes 26 and the first mass 14, electrostatically moves the first mass 14 relative to the substrate 12 along a linear path 34 as indicated by the double-headed arrow which has been enlarged for clarity. The actual path traversed by the first mass 14 is generally on the order of one micron or less.

In FIG. 1, the electrical connection between the actuation voltage source 32 (e.g. a power supply, function generator, or sine-wave generator) and only a few of the stationary electrodes 26 is shown for clarity. In a single-sided mode of operation, the source 32 can be connected to one-half of the total number of stationary electrodes 26, with the remaining electrodes 26 and the first and second masses, 14 and 20, being electrically grounded. This electrical grounding of the first and second masses, 14 and 20, can be performed by doping (e.g. with diffused or ion implanted boron or phosphorous) the first and second masses 14 and 20, the springs 16 and 24 and the anchors 18 for electrical conductivity so that a ground electrical connection from the actuation voltage source 32 can be made to the masses 14 and 24 through one or more of the anchors 18 and linear springs 16. Alternately, a double-sided mode of operation can be used, with one-half of the stationary electrodes 26 being operated at a voltage, $V_1$, and with the other half of the stationary electrodes 26 being operated at a different voltage, $V_2$. These modes of operation will be described in more detail hereinafter.

In the first embodiment of the present invention in FIG. 1, the substrate 12 can comprise monocrystalline silicon, with the first mass 14 and the second mass 20 generally comprising one or more layers of deposited and patterned polycrystalline silicon (also termed polysilicon). The MEM structure 10 of FIG. 1 can be formed using conventional micromachining processes as known to the art and as will be described hereinafter with reference to FIGS. 4A–4F.

In the embodiment of the MEM structure 10 in FIG. 1, the first mass 14, which is also termed herein a driving mass, can have lateral dimensions of, for example, 650 $\mu$m×1025 $\mu$m and a thickness of 2.5 $\mu$m to provide a mass of about 1.5 micrograms ($\mu$g). The first mass 14 can be suspended about 2 $\mu$m above the substrate 12 by four linear springs 16 having a total spring constant of, for example, $k_1$=1.3 Newton-meters$^{-1}$ (N-m$^{-1}$). The linear springs 16 can be formed of polysilicon, with one end of each spring being attached to the first mass 14 and with the other end of each spring 16 being attached to a polysilicon anchor 18 which is itself attached to the substrate 12. Each linear spring 16 can be about 1–2 $\mu$m wide and 2–3 $\mu$m thick and 100–500 $\mu$m long.

In FIG. 1, the stationary electrodes 26 are incorporated within an outline of the first mass 14. This saves space and forms a compact device 10. The actual number of stationary electrodes 26 can be varied depending upon the actuation requirements of the MEM structure 10. For clarity, only a small number of stationary electrodes 26 are shown in FIG. 1; whereas an actual device 10 can have many more stationary electrodes 26. For example, a total of 78 pairs of stationary electrodes 26 can be used with each stationary electrode 26 being about 120 $\mu$m long, and with a gap spacing between each stationary electrode 26 and the first mass 14 being about 2 $\mu$m.

The formation of a parallel-plate electrostatic actuator 30 is advantageous in that a substantial electrostatic force can be generated at a low actuation voltage when the gap spacing is small (i.e. ≦2 $\mu$m). However, motion of the first mass 14 towards the stationary electrodes 26 due to an electrostatic force of attraction reduces the gap spacing and thereby increases the force of attraction nonlinearly. As a result, the motion of the first mass 14 is generally only stable and controllable when this motion is limited to a fraction (e.g. one-third) of the gap spacing. For motion beyond that, a runaway condition exists which causes the first mass 14 to be rapidly slammed into the stationary electrodes 26 which can result in an electrical short circuit between the stationary electrodes 26 and the first mass 14 which are held at different electrical potentials. One or more stops (not shown) can be formed on the substrate 12 or an electrically-insulating overlayer (e.g. silicon nitride) can be formed on the stationary electrodes 26 to limit the possibility of such an electrical short circuit when the MEM structure 10 is operated at an actuation voltage, V, which is likely to cause permanent damage to the device 10 upon short-circuiting. At low voltages (i.e. ≦15 volts), such a short circuit can be non-damaging to the MEM structure 10 since an electrical current flow is limited by the resistance of the springs 16, the first mass 14, the stationary electrodes 26, associated wiring on the substrate 12 and any native oxide present on the contacting elements (i.e. the electrodes 26 and the first mass 14). A ground plane (not shown) is also preferably formed on the substrate 12 underneath the first mass 12, with the ground plane also being maintained at ground electrical potential.

In FIG. 1, a plurality of folded springs 24 are used to attach the second mass 20 to the first mass 14 and thereby suspend the second mass 20 about 1–3 $\mu$m above the substrate 12. The folded springs 24 can be formed of polysilicon with lateral dimensions similar to those of the linear springs 16, but with an increased width for reinforcement at each fold, and with a length that generally exceeds the length of the linear springs 16. The increased length of the folded springs 24 in FIG. 1 provides an overall spring constant $k_2$ (e.g. 0.5 N-m$^{-1}$) that is smaller than the overall spring constant, $k_1$ of the linear springs 16. The folded springs 24 and second mass 20 are located within a large window 22 formed in the first mass 14 to form a compact structure for the MEM device 10.

In FIG. 1, the second mass 20, which is also termed herein an absorbing mass, can be formed of polysilicon with lateral dimensions of, for example, 200 $\mu$m×450 $\mu$m and a thickness of 2.5 $\mu$m to provide a mass of 0.5 $\mu$g. The second mass 20 is not electrically actuated, but instead is free to oscillate in response to mechanical actuation produced by motion of the first mass 14 through the folded springs 24. This couples mechanical energy from the first mass 14 to the second mass 20 and produces oscillatory motion thereof along the same path 34 as the first mass 14.

Various operating modes of the MEM structure 10 of the present invention are possible depending upon the amplitude and frequency of an oscillatory activation force, F, (i.e. an electrostatic force of attraction) produced by the parallel-plate electrostatic actuator 30 in response to a cyclic actuation voltage, $V = V_0 \sin \omega t$. These operating modes include a pair of linear resonance modes, an antiresonant mode, and a contacting mode. The two resonance modes and the anti resonant mode can be understood with reference to FIG. 2 which shows a calculated frequency response curve of the MEM structure 10.

Figure 2:
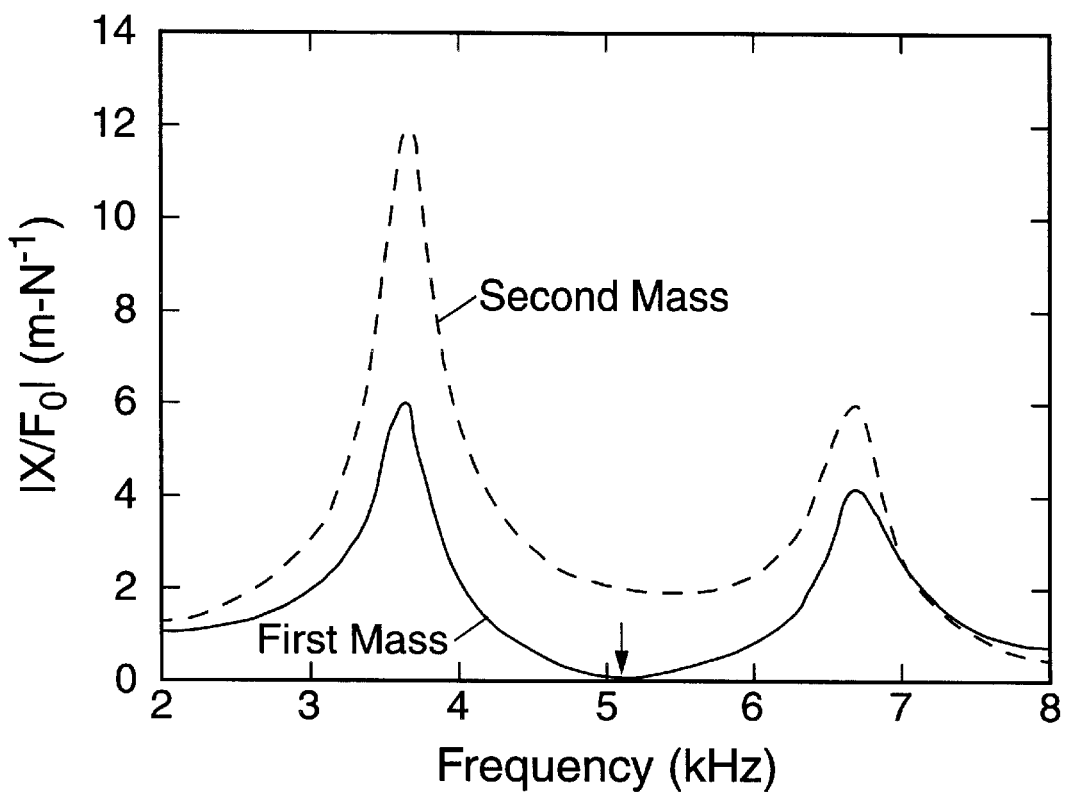
FIG. 2 shows calculated frequency response curves for oscillatory motion of the first and second masses in the MEM structure of FIG. 1.

In the frequency response curve of FIG. 2, the magnitude of a linear displacement, X, normalized to an oscillatory electrostatic activation force $F = F_0 \sin \omega_o t$ is plotted as a function of frequency for the first mass 14 (solid curve) and for the second mass 20 (dashed curve). Resonances in the displacement curves for the first mass 14 and the second mass 20 appear in the frequency response curve of FIG. 2 at about 3.7 kHz and 6.7 kHz. The exact frequencies of these resonances can be adjusted by particular selections of the masses for the first mass 14 and the second mass 20 and the spring constants $k_1$ and $k_2$. At a low-frequency resonance at about 3.7 kHz, the first and second masses, 14 and 20, are oscillating in phase; whereas at a high-frequency resonance at about 6.7 kHz, the two masses, 14 and 20, are oscillating 180º out-of-phase. In the frequency response curves of FIG. 2, the exact magnitude of $X/F_0$ for motion of the first mass 14 and the second mass 20 will depend upon damping which can arise due to the viscosity of an ambient atmosphere wherein the MEM structure 10 is operated. Although such damping can be greatly reduced by encapsulating the MEM structure 10 in a vacuum, it is also desirable to have a MEM structure 10 which is capable of operating at atmospheric pressure or above.

The frequency response curve of the first mass 14 in FIG. 2 also shows an antiresonant frequency at 5.1 kHz which is indicated by a vertical arrow. Antiresonance occurs when the two masses 14 and 20 are moving 90° out-of-phase with the second mass 20 also moving 180° out-of-phase with respect to the oscillatory electrostatic activation force, F. At this point, motion of the first mass 14 is at a minimum since the second mass 20 is moving such that it opposes the activation force, F, with the result that the force produced by the moving second mass 20, in the absence of damping, will exactly cancel out the effects of the activation force, F. Thus, the term "antiresonance" as used herein is defined as an operating point of the MEM structure 10 at a oscillatory frequency greater than zero wherein the first mass 14 undergoes a minimum displacement. In the presence of damping some slight motion of the first mass 14 is possible, although such motion will be at a minimum (e.g. on the order of 1 $\mu$m or less).

At the antiresonance frequency, the motion of the second mass 20 relative to that of the first mass 14 is at a maximum and varies only slightly with a change in the actuation frequency. Thus, by operating the MEM structure 10 of the present invention at or near the antiresonance frequency, the motion of the second mass 20 can be made substantially larger than the motion of the first mass 14, while at the same time being relatively insensitive to external factors such as damping, stress or mechanical shock as compared to operation at one of the resonant frequencies. As a result, the MEM structure 10 when operated in the antiresonant mode will be less sensitive to fabrication tolerances and packaging variations, and can use a simpler control system. Additionally, operating the MEM structure 10 in the antiresonant mode allows the device 10 to be operated over a wide range of pressure, including operation at atmospheric pressure or above.

A micron- or submicron-range oscillatory motion which must be provided to the first mass 14 at the antiresonance frequency to produce a substantially larger motion of the second mass 20 can be provided by the parallel-plate electrostatic actuator 30 as shown FIG. 1, with the actuator 30 being operated at a relatively low actuation voltage of generally $\leq 15$ volts, or $\leq 5$ volts for compatibility with complementary metal-oxide-semiconductor (CMOS) circuitry which can be fabricated on the same silicon substrate 12 as the MEM structure 10. The oscillatory motion produced in the second mass 20 at the antiresonance frequency can be up to 10–50 times larger than that of the first mass 14 so that an extent of motion of the second mass 20 can be several microns or more while the extent of motion of the first mass 14 is a fraction of a micron. In the absence of damping, the motion of the second mass at the antiresonance frequency is approximately equal to $F/k_2$, where F is the oscillatory actuation force produced by the parallel-plate electrostatic actuator 30 and $k_2$ is the overall spring constant for the folded springs 24 from which the second mass 20 is suspended. Furthermore, to first order, the motion of the second mass 20 in the MEM structure 10 is insensitive to changes in damping due to the ambient atmosphere.

Figure 3:
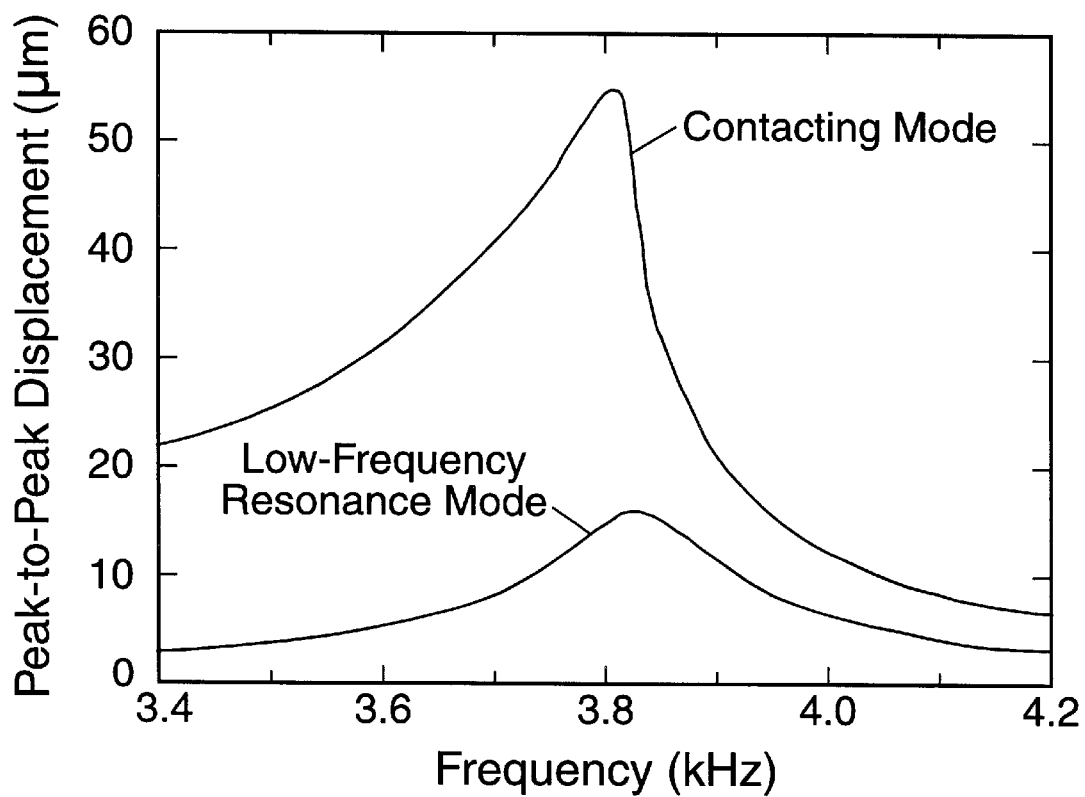
FIG. 3 shows a peak-to-peak displacement for the second mass as a function of the frequency of the oscillatory electrostatic activation force to illustrate operation of the MEM structure in a low-frequency resonant mode, and also in a contacting mode which produces a much larger peak-to-peak displacement.

Another mode of operation of the MEM structure 10 of FIG. 1 is possible wherein the first mass 14 is urged to contact the stationary electrodes 26. This contacting mode can produce a displacement motion of the second mass 20 at atmospheric pressure that is up to several tens of microns as shown in FIG. 3. In FIG. 3, the peak-to-peak displacement for the second mass 20 is plotted as a function of the frequency of the oscillatory electrostatic activation force, F, for activation voltages $V=V_0 \sin \omega t$ with $V_0=8$ volts and 11 volts, respectively. For $V_0=8$ volts, operation of the MEM structure 10 occurs in the low-frequency resonant mode with a maximum peak-to-peak displacement of about 16 $\mu$m; whereas for operation at a higher voltage of $V_0=11$ volts, operation of the MEM structure 10 occurs in the contacting mode with a much larger maximum peak-to-peak displacement exceeding 50 $\mu$m.

In FIG. 3, the contacting mode occurs at a frequency near the low-frequency resonance when an actuation voltage is provided between the stationary electrodes 26 and the first mass 14 of sufficient magnitude to urge the first mass 14 into contact with the stationary electrodes 26. As the gap between the first mass 14 and the stationary electrodes 26 is reduced, a nonlinearly increasing actuation force, F, is generated which slams the first mass 14 into the stationary electrodes 26. Normally this is to be avoided in a conventional electrostatic actuator (i.e. a comb actuator) which operates at a much higher voltage since can lead to the generation of an electrical short circuit between the stationary and moveable electrodes therein which can be permanently destructive.

However, in the MEM structure 10 of the present invention, low actuation voltages of $\leq 15$ volts are used so that no permanent destruction occurs despite the electrical contact between the first mass 14 and the stationary electrodes 26. All that happens is a small electrical current flows between the stationary electrodes 26 and the first mass 14 which is grounded. The magnitude of this electrical current is limited by the electrical resistance of the springs 16, the first mass 14, the stationary electrodes 26, associated wiring (not shown) on the substrate, and any native oxide on the first mass 14 and on the stationary electrodes 26 so that the electrical current is insufficient to produce any destructive effects on the MEM structure 10. In fact, the small electrical current can be monitored to provide an indication that the MEM structure 10 is being operated in the contacting mode, and can even be used in a feedback control circuit to adjust the actuation voltage as needed to maintain the MEM structure 10 in the contacting mode. In other embodiments of the present invention, a thin insulating coating (e.g. about 50–200 nm of silicon nitride) can be provided over the stationary electrodes 26 to prevent the possibility of any electrical short circuiting.

In the contacting mode of FIG. 3, a substantial force, F, is produced by the parallel-plate electrostatic actuator 30 which can be coupled through the folded springs 24 to the second mass 20 to produce a large oscillatory motion thereof. In this way the displacement of the second mass 20 can be increased several fold compared to operation of the MEM structure 10 in the non-contacting low-frequency resonant mode (see FIG. 3). In this contacting mode of operation, the extent of motion of the second mass 20 in the MEM structure 10 of FIG. 1 is generally limited by contact between adjacent arms of each folded spring 24.

The large range of motion provided by the MEM structure 10 of the present invention when operating in the contacting mode can be used to advantage for forming a moving-mass gyroscope 10 (i.e. a resonating gyroscope) since in such a device 10, the detection sensitivity increases with the extent of motion of a sensing mass therein (i.e. the second mass 20). For use in such a moving-mass gyroscope 10, the activation voltage can be adjusted so that the contacting mode is initiated, but at a level such that no out-of-plane movement (i.e. in a direction normal to the substrate 12) is produced at the second mass 20 as a result of the contact between the first mass 14 and the stationary electrodes 26. This provides a maximum sensitivity for the moving-mass gyroscope 10 in which an out-of-plane movement of the second mass 20 is produced in response to movement of the substrate 12, with the out-of-plane movement of the second mass 20 being capacitively sensed by a planar position-sensing electrode 36 on the substrate 12 underlying the second mass 20 as shown in FIG. 1.

The other operating modes of the MEM structure 10 can also be used for forming a moving-mass gyroscope 10. In particular, operation in the antiresonance mode is useful since the actuation voltage, V, can be reduced while still providing an increased motion of the second mass 20 compared to the motion of the first mass 14. This provides an increased sensitivity for position sensing of the device 10 while reducing an electrical noise level in the device 10.

FIGS. 4A–4F schematically illustrate in cross-section view along the section line 1—1 in FIG. 1 a process for forming the MEM structure 10 using surface micromachining. Surface micromachining processes as known to the art are generally based on the deposition and photolithographic patterning of alternate layers of polysilicon and a sacrificial material such as silicon dioxide ($SiO_2$) or a silicate glass (e.g. deposited from the decomposition of tetraethylortho silicate, also termed TEOS). Vias can be etched through the sacrificial material to provide anchor points to the substrate and between adjacent polysilicon layers. The polysilicon layers can be patterned and built up layer by layer to form various members of the MEM device structure. Once the MEM device structure is completed, the sacrificial material is partially or completely removed (e.g. by exposure to a selective etchant which etches away the sacrificial material, but which does not chemically attack the polysilicon layers) to release the polysilicon members of the MEM device for operation. For the MEM structure 10 of FIG. 1, a total of two layers of polysilicon are required, with a first polysilicon layer 38 forming a ground plane underlying the first mass 14 and also generally underlying the springs 16 and 24. The first polysilicon layer 38 can also be used to form a position-sensing electrode superposed below the second mass 20. A second polysilicon layer 40 can then be used to form the stationary electrodes 26, the first and second masses 14 and 24, the springs 16 and 24, and the anchors 18. In some embodiments of the present invention, additional polysilicon layers (not shown) can be deposited and patterned over the second polysilicon layer 40 to further build up the height and mass of the first and second masses 14 and 20, and also to build up the height of the springs 16 and 24 and the anchors 18.

Figure 4A:
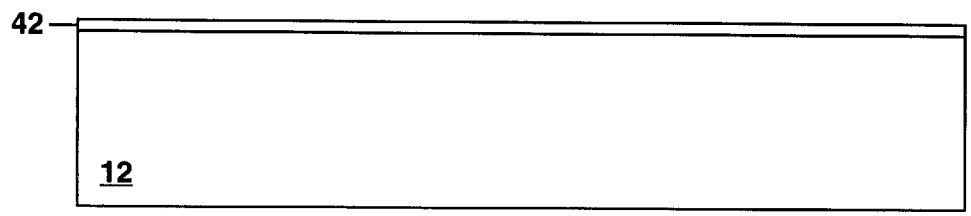
FIGS. 4A–4F schematically illustrate in cross-section view a process for forming the MEM structure of FIG. 1 using surfacemicromachining.

In FIG. 4A, a thin blanket layer of a thermal oxide (not shown) is formed over a top surface of a monocrystalline silicon substrate 12. The thermal oxide layer, which can be about 60 nanometers thick, can be formed by a conventional thermal diffusion process as known to the integrated circuit art. An electrically-insulating layer 42 of silicon nitride is then blanket deposited over the substrate 12 to a layer thickness of 200–300 nanometers using a low-pressure chemical vapor deposition (LPCVD) process.

Figure 4B:
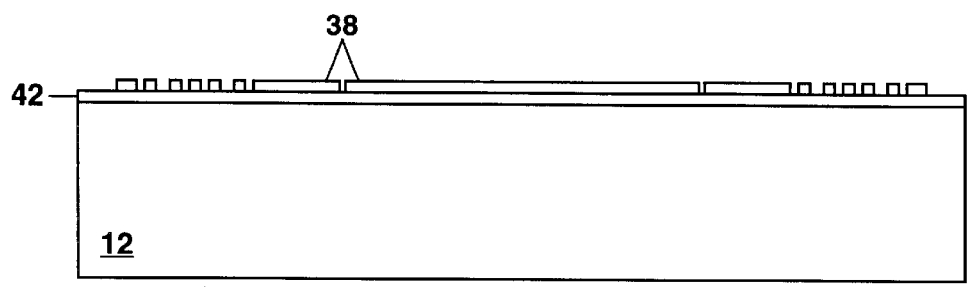

In FIG. 4B, a first polysilicon layer 38 about 300 nanometers thick is blanket deposited over the electrically-insulating layer 42 and patterned by reactive ion etching to begin to build up the various elements of the MEM structure 10 including a ground plane 44, the position-sensing electrode 36, the anchors 18 and the stationary electrodes 26. The first polysilicon layer 38 is also patterned to provide electrical wiring (not shown) on the substrate 12 to various elements of the MEM structure 10. The term "patterning" as used herein refers to a sequence of well-known semiconductor integrated circuit processing steps including applying a photoresist to the substrate 12, prebaking the photoresist, aligning the substrate 12 with a photomask, exposing the photoresist through the photomask, developing the photoresist, baking the photoresist, etching away the surfaces not protected by the photoresist, and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 75020 C. and densified by a high temperature processing) overlying a polysilicon or sacrificial material layer in preparation for defining features into the layer by anisotropic dry etching (e.g. reactive ion etching).

The first polysilicon layer 38 and any other polysilicon layers can be deposited by LPCVD at a temperature of about 58020 C. Doping of the first polysilicon layer 38 for electrical conductivity can be performed during deposition, or after deposition using thermal diffusion or ion implantation of boron or phosphorous. After patterning of each polysilicon layer, that layer can be thermally annealed (e.g. at 1100° C. for three hours) to relieve any stress therein. The annealing step can also be performed after deposition of a sacrificial material 46 over each polysilicon layer.

Figure 4C:
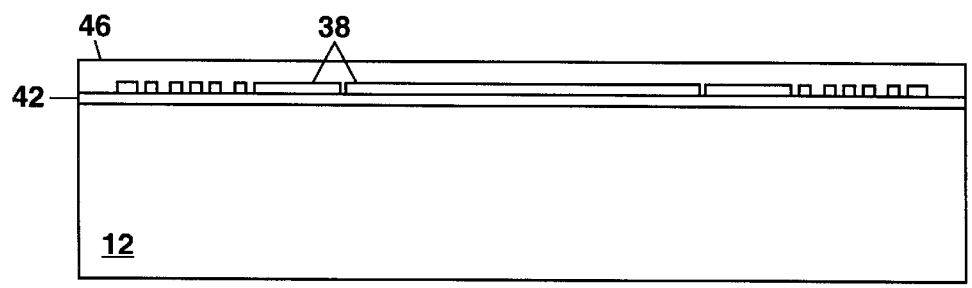

In FIG. 4C, a layer of a sacrificial material 46 (e.g. silicon dioxide or a silicon glass such as TEOS) is blanket deposited over the substrate by LPCVD covering the patterned first polysilicon layer 38. The layer of the sacrificial material 46 can be, for example, about 1–3 $\mu$m thick depending upon a predetermined spacings between the ground plane 44 and the first mass 14, and between the position-sensing electrode 36 and the second mass 20. The term "sacrificial material" as used herein refers to a material (generally silicon dioxide or a silicate glass) that can be deposited and patterned as an aid in building up the MEM structure 10 and which can later be removed to release the MEM structure 10 for operation by etching away the sacrificial material with a selective etchant that does not substantially attack other structural materials on the substrate or used to build-up the MEM structure 10 (e.g. polysilicon and silicon nitride).

The sacrificial material 46 can be deposited to a greater thickness than is required and then planarized by chemical-mechanical polishing (CMP) as known to the art. This allows the layer thickness of the sacrificial material 46 to be precisely adjusted while at the same time reducing any variations in the surface topography arising from deposition of the sacrificial material 46 over the patterned first polysilicon layer 38. Chemical-mechanical polishing as applied to surface micromachining has been disclosed, for example, in U.S. Pat. No. 5,804,084 to Nasby which is incorporated herein by reference.

Figure 4D:
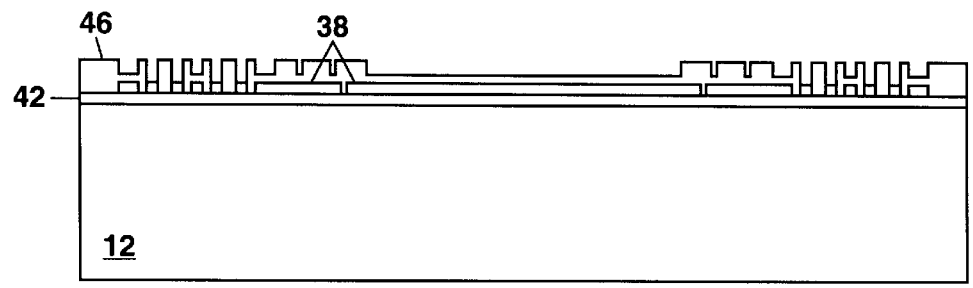

In FIG. 4D, the layer of the sacrificial material 46 is patterned to form a plurality of openings therein, including openings down to the first polysilicon layer 38 at the locations of the stationary electrodes 26 and the anchors 18, and openings partially through the layer of the sacrificial material 46 at the locations of elements of the MEM structure 10 which are to be suspended above the substrate 12 (e.g. the first and second masses, 14 and 20, and the springs 16 and 24). The patterned sacrificial material 46 thus acts as a mold for a subsequently-deposited second polysilicon layer 40 which is used to further build-up the MEM structure 10.

Figure 4E:
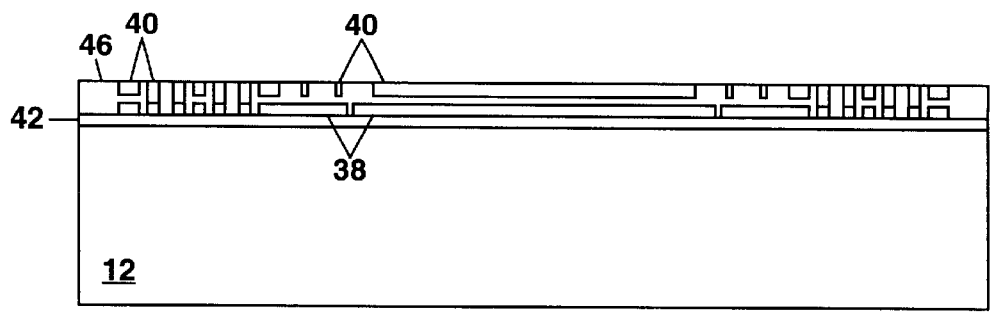

In FIG. 4E, the second polysilicon layer 40 is blanket deposited over the substrate 12 by LPCVD and fills in the openings in the layer of the sacrificial material 46. The second polysilicon layer 40 can then be planarized by CMP down to the level of the sacrificial material 46 thereby removing excess polysilicon not needed for forming the various elements of the MEM structure 10. The second polysilicon layer 40 can be annealed to relieve any stress therein using the procedure discussed previously. If additional layers of polysilicon are needed to build up the MEM structure 10, the steps described with reference to FIGS. 4B–4E can be repeated.

Figure 4F:
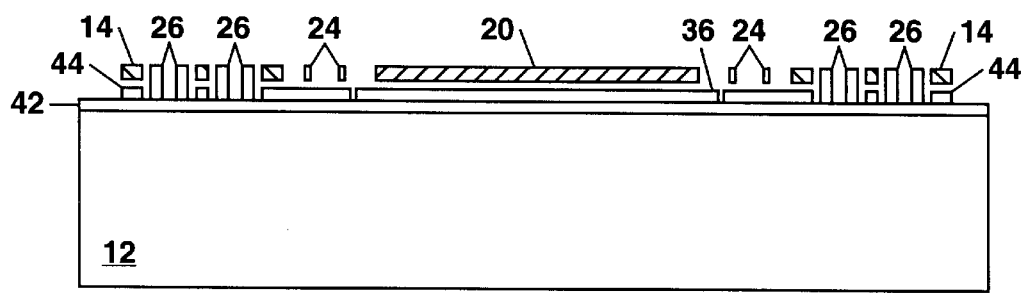

In FIG. 4F, the MEM structure 10 is completed and released for operation by etching away the sacrificial material 46 with a selective wet etchant comprising hydrofluoric acid (HF). This etch step can be timed to remove all the exposed sacrificial material 46 while not damaging the silicon substrate 12 or various elements of the MEM structure 10 that are formed of materials not subject to chemical attack by the selective wet etchant (e.g. polysilicon and silicon nitride). A plurality of MEM structures 10 formed on a common wafer can then be separated by dicing and packaged using conventional integrated circuit or micromachine packaging methods as known to the art.

Figure 5:
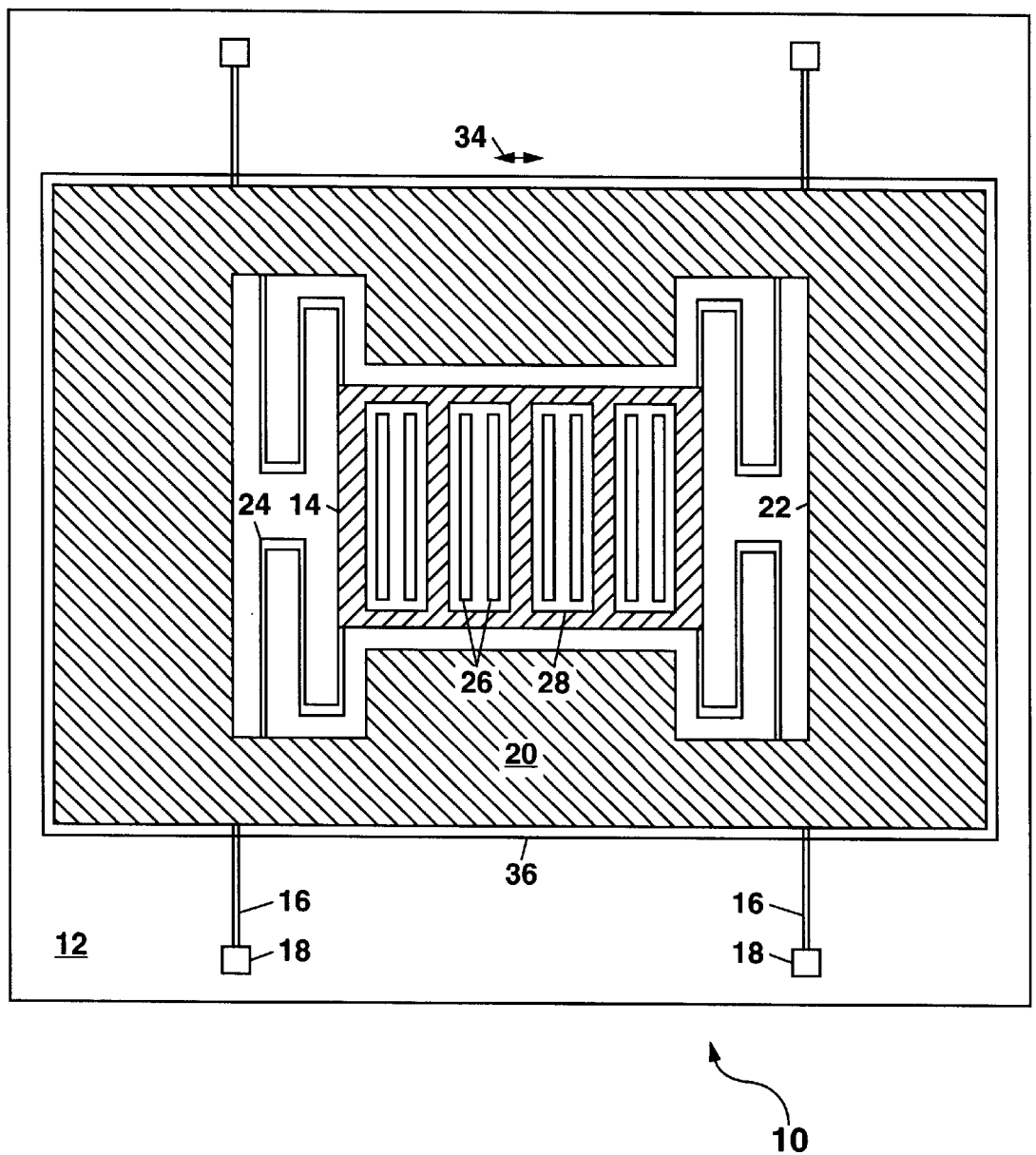
FIG. 5 schematically illustrates in plan view a second embodiment of the MEM structure of the present invention.

In other embodiments of the present invention, the locations of the first mass 14 and the second mass 20 can be reversed so that the first mass 14 with its parallel-plate electrostatic actuator 30 can be formed within a window formed in the second mass 20. This is shown in a second embodiment of the MEM structure 10 of the present invention which is shown schematically in plan view in FIG. 5. In FIG. 5, the positions of the first and second masses 14 and 20 are reversed compared with FIG. 1, with the second mass 20 surrounding the first mass 14. The first mass 14 still has a plurality of small windows 28 wherein stationary electrodes 26 are formed for actuation of the first mass 14. The second embodiment of the MEM structure 10 can be fabricated as described previously with reference to FIGS. 4A–4F.

It is also possible to locate the second mass 20 outside the first mass 14 and adjacent thereto. This can be done, for example, to form a MEM structure 10 as shown in a third embodiment of the MEM structure 10 of the present invention in FIG. 6. The third embodiment of the MEM structure 10 can be fabricated as described previously with reference to FIGS. 4A–4F.

Figure 6:
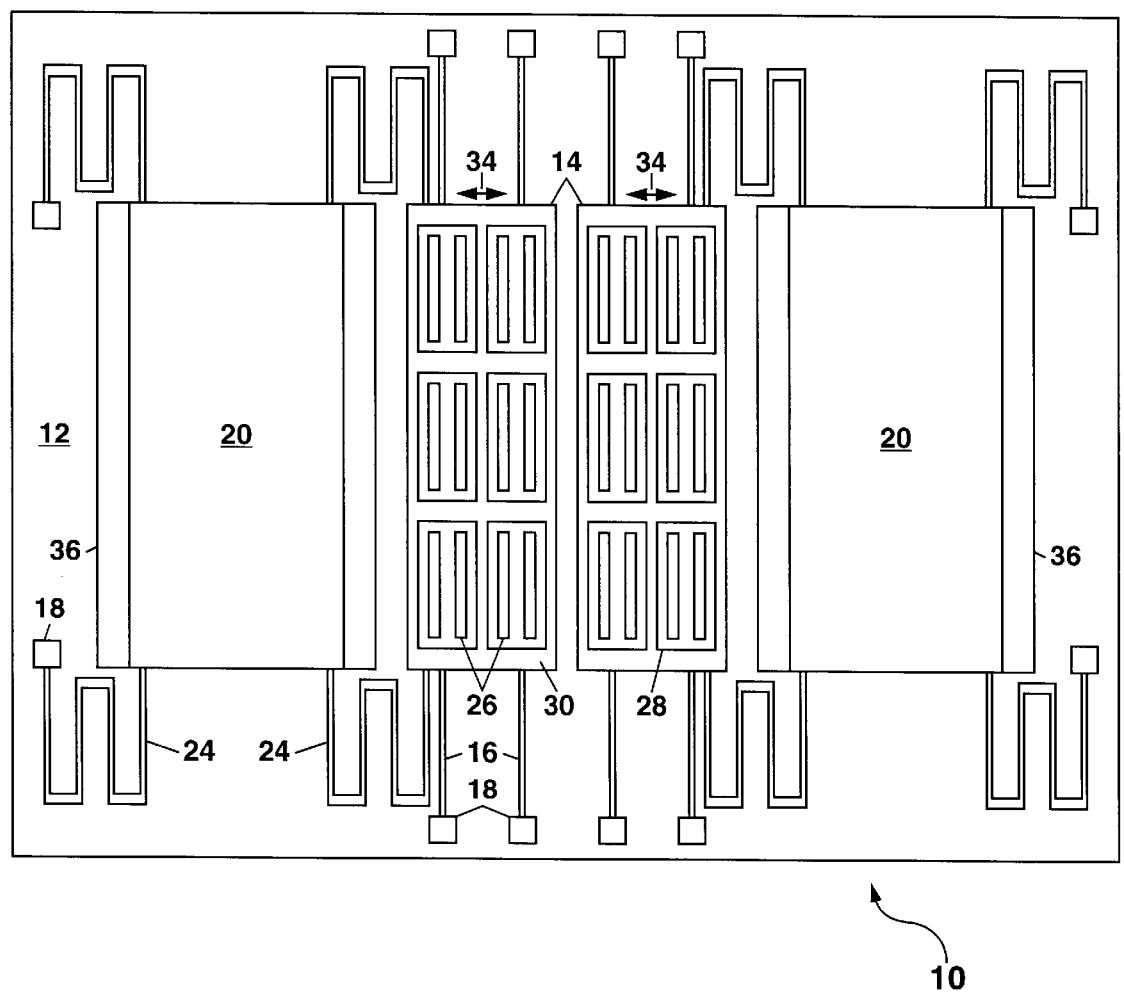
FIG. 6 schematically illustrates in plan view a third embodiment of the MEM structure of the present invention.

In FIG. 6, each second mass 20 is coupled to one of the first masses 14 by a plurality of folded springs 24, with additional folded springs 24 being connected to the substrate 12 through anchors 18. This arrangement of the MEM structure 10 allows each second mass 20 to be driven by oscillatory motion of one of the first masses 14, with the two second masses 20 moving out-of-phase with respect to each other at any instant in time. This arrangement of the MEM structure 10 can be advantageous for cancelling out common mode errors when output signals (e.g. from the position-sensing electrodes 36) produced by motion of the two second masses 20 are combined. This allows errors due to changes in temperature or viscosity to be substantially reduced since these changes will affect the output signals from each second mass 20 about the same. Additionally, this common-mode arrangement of the MEM structure 10 can be used to eliminate errors due to linear acceleration.

In the embodiments of the present invention in FIGS. 1, 5 and 6, the path traversed by motion of the first and second masses 14 and 20 is a linear path 34 defined by a particular direction in a plane parallel to the plane of the substrate 12. In a fourth embodiment of the present invention shown in FIG. 7, the first and second masses 14 and 20 are designed to traverse a curved path 48 in a plane parallel to the plane of the substrate 12.

Figure 7:
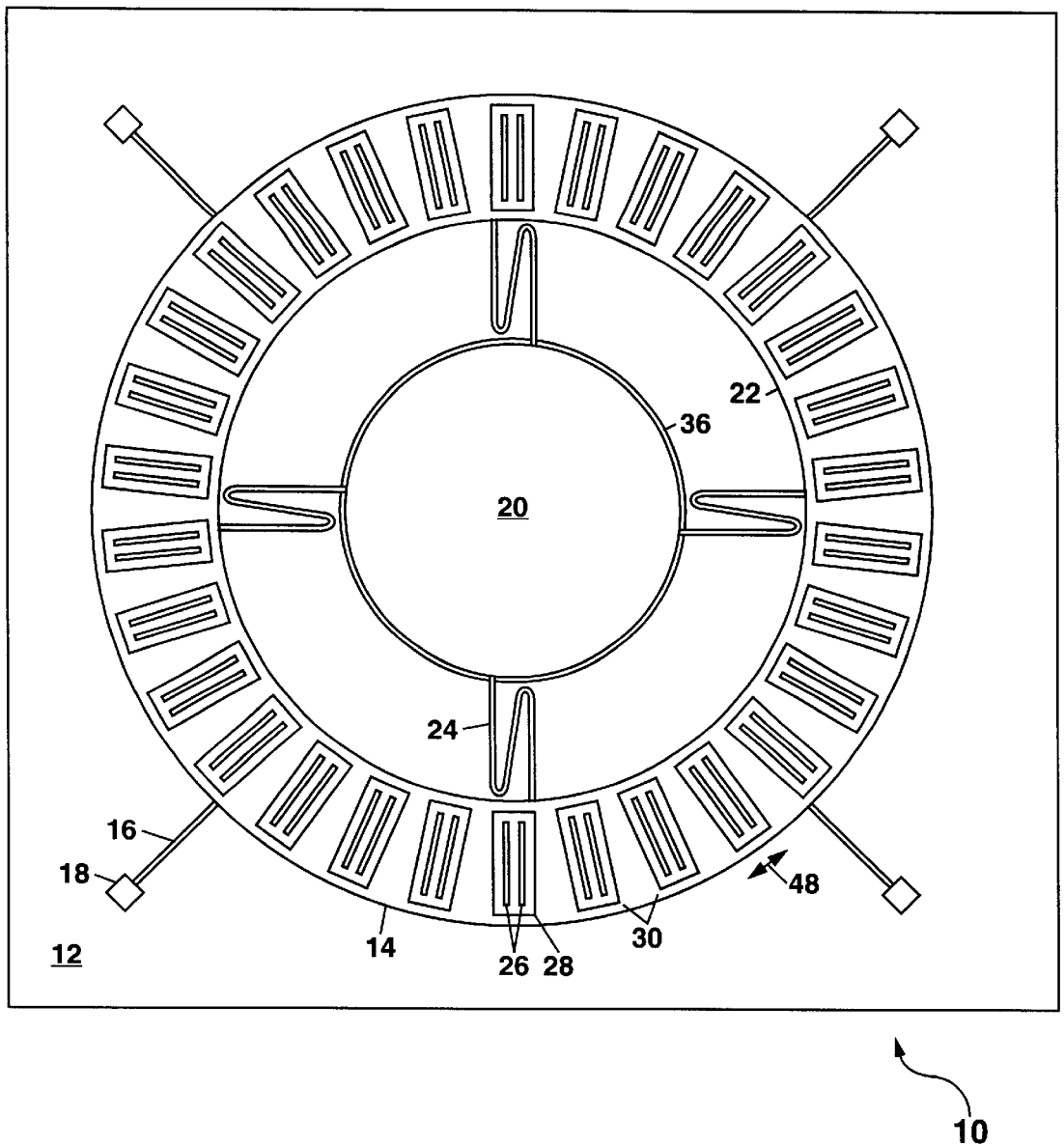
FIG. 7 schematically illustrates in plan view a fourth embodiment of the MEM structure of the present invention.

The structure of the fourth embodiment of the present invention in FIG. 7 is similar to the first embodiment of the MEM structure 10 except that the oscillatory motion of the suspended first and second masses 14 and 20 is curvilinear rather than linear. A parallel-plate electrostatic actuator 30 in FIG. 7 is formed by a plurality of stationary electrodes 26 located within windows 28 formed in a first mass 14 suspended above the substrate 12 so that the first mass 14, which forms a moveable electrode, oscillates back and forth along a curved path 48 upon the application of a cyclic actuation voltage between the stationary electrodes 26 and the first mass 14. A ground side of the actuation voltage is electrically connected to the first mass 14 through the linear springs 16 and anchors 18 from wiring (not shown) formed on the substrate 12. Such wiring, a ground plane which underlies the first mass 14 and a position-sensing electrode 36 underlying the second mass 20 can be formed from a first polysilicon layer 38 as described with reference to FIG. 4B. A high side of the actuation voltage is electrically connected to particular stationary electrodes 26 using additional wiring (not shown) formed on the substrate 12 from the first polysilicon layer 38. In some instances, a double-sided drive arrangement can be used wherein a first set of stationary electrodes 26 (e.g. comprising a clockwise-looking electrode 26 in each window 28 in FIG. 7) is driven with an actuation voltage $V_1=V_{dc}+V_{ac}$ where $V_{dc}$ represents a direct-current (dc) voltage and $V_{ac}$ represents an alternating-current (ac) voltage, and a second set of the stationary electrodes 26 (e.g. comprising a counterclockwise-looking electrode 26 in each window 28 in FIG. 7) is driven with an actuation voltage $V_2=V_{dc}-V_{ac}$.

In FIG. 7, a second mass 20 is suspended above the substrate 12 by a plurality of folded springs 24 which connect the second mass 20 to the suspended first mass 14, with the folded springs 24 further acting to transfer a portion of the actuation force, F, to the second mass 20 to cause oscillatory motion thereof. As described earlier for the first embodiment of the present invention, a number of different modes of oscillation of the second mass 20 are possible, including a pair of resonant modes and an antiresonant mode. Additionally, a contacting mode is possible if the actuation voltage is increased sufficiently so that the first mass 14 is driven to contact the stationary electrodes 26.

The fourth embodiment of the present invention in FIG. 7 can be formed similarly to the first embodiment, with the first mass 14 generally having a diameter in the range of about 100 μm up to several millimeters and with the second mass 20 being smaller so that it can fit within a large window 22 formed through the first mass 14. The first and second masses 14 and 20 can be suspended about 1–3 μm above the substrate 12; and each have a thickness in the range of about 2–10 μm. A gap spacing between each stationary electrode 26 and the first mass 14 can be, for example, 2 μm.

With activation of the MEM structure 10 in FIG. 7, any external rotation of the substrate 12 will induce the oscillating second mass 20 to also oscillate up and down with respect to the position-sensing electrode 36. The phase of the induced oscillation depends upon the direction of rotation of the substrate 12; and the magnitude of the induced oscillation depends upon an angular rotation rate of the substrate 12. The second mass 20 and the position-sensing electrode 36 in combination form a capacitor so that any vertical movement of the second mass 20 relative to the electrode 36 changes the capacitance. This change in capacitance can be electronically sensed (e.g. with a capacitance bridge circuit formed on or off the substrate 12, or by electrically charging the capacitor and detecting an electrical current produced due to the change in capacitance) to provide an indication of the direction and magnitude of the rotation of the MEM structure 10, thereby forming a rotation-rate sensor.

Those skilled in the art will recognize that other variations of the MEM structure 10 of FIG. 7 are possible according to the present invention. For example, the positions of the first and second masses 14 and 20 can be reversed so that the second mass 20 is annular in shape and is forced to oscillate about the first mass 14.

The MEM structure 10 of the present invention has applications for forming resonant sensors for detecting strain, acceleration, rotation or movement. Such resonant sensors have many different uses, including inertial sensing and navigation, automotive braking and traction control systems, computer joysticks or mouses, etc. Multiple devices 10 as shown in FIGS. 1 and 5–7 can be combined on a common substrate 12 for sensing strain, acceleration, rotation or movement in a plurality of different directions.

Other applications and variations of the present invention will become evident to those skilled in the art. The actual scope of the invention is intended to be defined in the following claims when viewed in their proper perspective based on the prior art.

What is claimed is:

1. A microelectromechanical (MEM) structure, comprising:
   (a) a parallel-plate electrostatic actuator which further comprises a plurality of stationary electrodes formed on a substrate and a first mass suspended above the substrate to form a moveable electrode, with the first mass moving along a path in a plane parallel to the plane of the substrate and in a direction perpendicular to the length of the stationary electrodes in response to an actuation voltage applied between the stationary electrodes and the first mass; and
   (b) a second mass suspended above the substrate and coupled to the first mass by a plurality of springs, with the second mass being driven by motion of the first mass to move along the same path.

2. The MEM structure of claim 1 wherein each stationary electrode is located within a window formed through the first mass.

3. The MEM structure of claim 1 wherein the second mass is located within a window formed through the first mass.

4. The MEM structure of claim 1 wherein the second mass is located proximate to the first mass.

5. The MEM structure of claim 1 wherein the first mass is located within a window formed through the second mass.

6. The MEM structure of claim 1 wherein motion of the first and second masses is oscillatory, and the second mass is driven near an antiresonance frequency by the oscillatory motion of the first mass.

7. The MEM structure of claim 1 wherein motion of the first and second masses is oscillatory, and the second mass is driven near a resonant frequency by the oscillatory motion of the first mass.

8. The MEM structure of claim 1 wherein the motion of the first and second masses is oscillatory, and the first mass is driven to contact at least a portion of the stationary electrodes.

9. The MEM structure of claim 1 wherein an extent of motion of the second mass is larger than the extent of motion of the first mass upon actuation of the first mass.

10. The MEM structure of claim 1 wherein the substrate comprises silicon.

11. The MEM structure of claim 1 wherein the first and second masses comprise polycrystalline silicon.

12. The MEM structure of claim 1 wherein the actuation voltage is cyclic.

13. The MEM structure of claim 12 wherein the actuation voltage is sinusoidal.

14. The MEM structure of claim 1 wherein the actuation voltage is $\leq 15$ volts.

15. The MEM structure of claim 1 further including a position-sensing electrode located on the substrate below the second mass.

16. The MEM structure of claim 15 further including a ground plane located on the substrate below the first mass.

17. A microelectromechanical (MEM) structure, comprising:
   (a) a substrate;
   (b) a first mass suspended above the substrate and having a plurality of windows formed therethrough;
   (c) a plurality of stationary electrodes formed on the substrate with each stationary electrode being located within one of the windows in the first mass, the stationary electrodes acting in combination with the first mass to form a parallel-plate electrostatic actuator to electrostatically move the first mass relative to the substrate along a path in response to an actuation voltage provided between the stationary electrodes and the first mass;
   (d) a second mass coupled to the first mass through a plurality of springs, with the second mass being driven to move along the same path in response to motion of the first mass; and
   (e) a position-sensing electrode located on the substrate below the second mass.

18. The MEM structure of claim 17 further including a ground plane formed on the substrate underneath the first mass.

19. The MEM structure of claim 17 wherein an extent of motion of the second mass is larger than the extent of motion of the first mass upon actuation of the first mass.

20. The MEM structure of claim 17 wherein motion of the first and second masses is oscillatory.

21. The MEM structure of claim 20 wherein the actuation voltage is cyclic.

22. The MEM structure of claim 20 further including a voltage source connected to the parallel-plate electrostatic actuator to drive the second mass to oscillate near an antiresonance frequency by the oscillatory motion of the first mass.

23. The MEM structure of claim 20 further including a voltage source connected to the parallel-plate electrostatic actuator to drive the second mass to oscillate near a resonance frequency by the oscillatory motion of the first mass.

24. The MEM structure of claim 20 further including a voltage source connected to the parallel-plate electrostatic actuator to drive the first mass to contact at least a portion of the stationary electrodes.

25. The MEM structure of claim 17 wherein the first mass surrounds the second mass.

26. The MEM structure of claim 17 wherein the second mass surrounds the first mass.

27. The MEM structure of claim 17 wherein the second mass is located proximate to the first mass.

28. The MEM structure of claim 17 wherein the first and second masses are formed from at least one layer of polycrystalline silicon.

29. The MEM structure of claim 17 wherein the actuation voltage is $\leq 15$ volts.

30. A microelectromechanical (MEM) structure, comprising:
   (a) a parallel-plate electrostatic actuator formed on a substrate and comprising a first mass suspended above the substrate and having a plurality of windows formed therethrough, and a plurality of stationary electrodes formed on the substrate at the locations of the windows in the first mass, the stationary electrodes acting in combination with the first mass to electrostatically move the first mass along a path in response to an actuation voltage provided between the stationary electrodes and the first mass; and
   (b) a second mass located within one of the windows in the first mass, with the second mass being coupled to the first mass through a plurality of springs and further being driven to move along the same path as the first mass in response to motion of the first mass.

31. The MEM structure of claim 30 further including a position-sensing electrode formed on the substrate below the second mass.

32. The MEM structure of claim 31 further including a ground plane formed on the substrate below the first mass.

33. The MEM structure of claim 30 wherein the motion of the first mass is oscillatory, and the second mass is urged by the motion of the first mass to oscillate in a mode selected from the group consisting of a resonant mode, an antiresonant mode, and a contacting mode.

34. The MEM structure of claim 30 wherein the substrate comprises silicon.

35. The MEM structure of claim 30 wherein the first and second masses comprise polycrystalline silicon.

36. The MEM structure of claim 30 wherein the second mass has a range of motion that is larger than the range of motion of the first mass.

37. The MEM structure of claim 30 wherein each spring coupling the first mass to the second mass comprises a folded spring.

* * * * *